United States Patent [19]
Mizuno et al.

[11] Patent Number: 5,302,844
[45] Date of Patent: Apr. 12, 1994

[54] SEMICONDUCTOR DEVICE AND METHOD FOR MANUFACTURING THE SAME

[75] Inventors: Tomohisa Mizuno; Shizuo Sawada, both of Yokohama, Japan

[73] Assignee: Kabushiki Kaisha Toshiba, Kawasaki, Japan

[21] Appl. No.: 15,676

[22] Filed: Feb. 9, 1993

Related U.S. Application Data

[63] Continuation of Ser. No. 672,322, Mar. 20, 1991.

[30] Foreign Application Priority Data

Mar. 20, 1990 [JP] Japan ................................. 2-68080

[51] Int. Cl.⁵ ..................... H01L 27/02; H01L 29/68; H01L 29/78; H01L 29/92
[52] U.S. Cl. .......................... 257/396; 257/306; 257/307; 257/532; 257/535
[58] Field of Search ............... 257/528, 532, 534, 535, 257/516, 296, 303, 306, 307, 308, 309; 357/23.6, 51

[56] References Cited

U.S. PATENT DOCUMENTS

| | | | |
|---|---|---|---|
| 4,866,493 | 9/1989 | Arina et al. | 357/51 |
| 4,907,046 | 3/1990 | Ohii et al. | 357/51 |
| 4,970,564 | 11/1990 | Kimura et al. | 357/23.6 |
| 5,068,698 | 11/1991 | Koyama | 387/23.6 |
| 5,091,761 | 2/1992 | Hiraiwa et al. | 357/51 |
| 5,095,346 | 3/1992 | Bae et al. | 357/51 |
| 5,124,767 | 6/1992 | Koyama | 257/307 |

*Primary Examiner*—Sheila V. Clark
*Attorney, Agent, or Firm*—Banner, Birch, McKie & Beckett

[57] ABSTRACT

According to the present invention, a lower electrode is formed on a semiconductor substrate and overgrows upward to form one electrode of a capacitor having a mushroom-shaped section. An insulation film is formed so as to at least cover the lower electrode. An upper electrode is formed so as to oppose the lower electrode and to cover at least the insulation film.

22 Claims, 2 Drawing Sheets

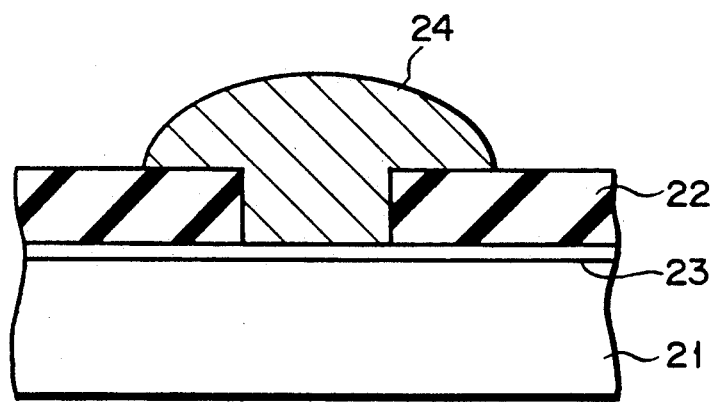
F I G. 2A

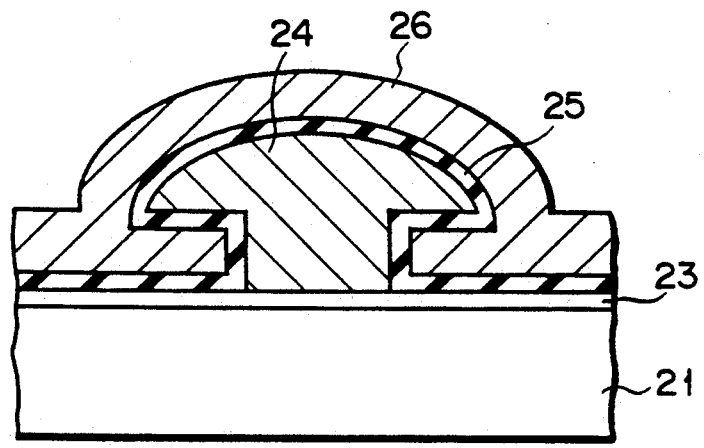
F I G. 2B
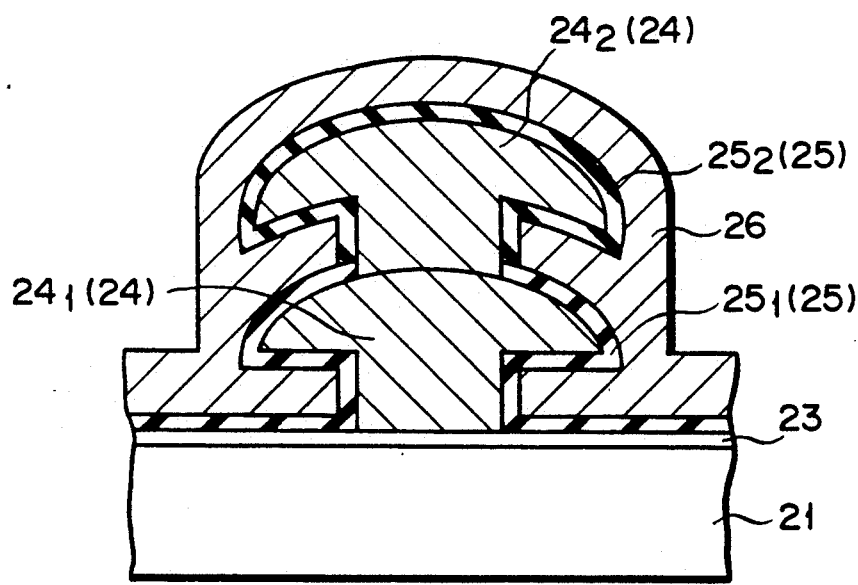
F I G. 3

SEMICONDUCTOR DEVICE AND METHOD FOR MANUFACTURING THE SAME

This application is a continuation of application Ser. No. 07/672,322, filed Mar. 20, 1991.

BACKGROUND OF THE INVENTION

1. Field of the Invention

The present invention relates to a semiconductor device and a method for manufacturing the same and, more particularly, to a semiconductor device for use in a memory cell capacitor.

2. Description of the Related Art

A conventional cell capacitor is shown in FIG. 1. After a P-type silicon substrate 1 is thermally oxidized to form a field oxide film 2 having a thickness of 5000 Å, an oxide film 3 having a thickness of 100 Å is formed. Ions $As^+$ are then implanted to form an $N^+$ layer 4. A polysilicon 5 is deposited and patterned to serve as a plate electrode.

The cell capacitor having a plane structure as shown in FIG. 1 is simple to manufacture and has been widely applied to the extent of 1 M-bit dynamic random access memory (DRAM). Since the plane structure, however, reduces the area of a cell when the degree of integration of the cell is enhanced, the thickness of a gate oxide film (oxide film 3) needs to be thinned to retain stored charges to some extent, which degrades the reliability of the oxide film 3. The plane structure cannot be physically applied to a cell capacitor of a DRAM of 4 M-bit or more.

SUMMARY OF THE INVENTION

It is accordingly an object of the present invention to provide a capacitor which has a high degree of integration and high reliability and which is simple to manufacture, and a method for manufacturing the same.

To attain the above object, there is provided a semiconductor device, comprising: a semiconductor substrate; a lower electrode formed on the semiconductor substrate and overgrowing upward to form one electrode of a capacitor having a mushroom-shaped section; an insulation film formed so as to cover at least the lower electrode; and an upper electrode opposing the lower electrode and formed so as to cover at least the insulation film.

Further, there is provided a method for manufacturing a semiconductor device, comprising the steps of: forming a lower electrode having a mushroom-shaped section on a semiconductor substrate so as to overgrow upward by a selective growth method, thereby forming one electrode of a capacitor; covering at least a surface of the lower electrode with an insulation film; and forming other electrode of the capacitor so as to cover at least the insulation film and oppose the lower electrode.

The semiconductor device according to the present invention is a modification to a stack capacitor cell (STC), in which one of electrodes of a capacitor is formed like a mushroom or a plurality of mushrooms stacked on one another, on a semiconductor substrate. The mushroom-shaped electrode is overgrown by a selective growth method or a selective epitaxial growth (SEG) method. If an insulation film and the other electrode of the capacitor are formed so as to cover the mushroom-shaped electrode, the degree of integration of the capacitor is increased. It is thus unnecessary to thin the insulation film between the electrodes. Since self-alignment can be attained in manufacturing the capacitor as described later, the capacitor can be improved in reliability. Using an $N^+$ epitaxial growth method, $N^+$ ions need not be implanted into the semiconductor substrate; accordingly, manufacturing steps can be simplified.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A and 2B are views showing steps of manufacturing a cell capacitor according to an embodiment of the present invention; and FIG. 3 is a view showing a constitution and a manufacturing step of a cell capacitor according to another embodiment of the present invention.

DETAILED DESCRIPTION OF THE PREFERRED EMBODIMENTS

Figure 1:
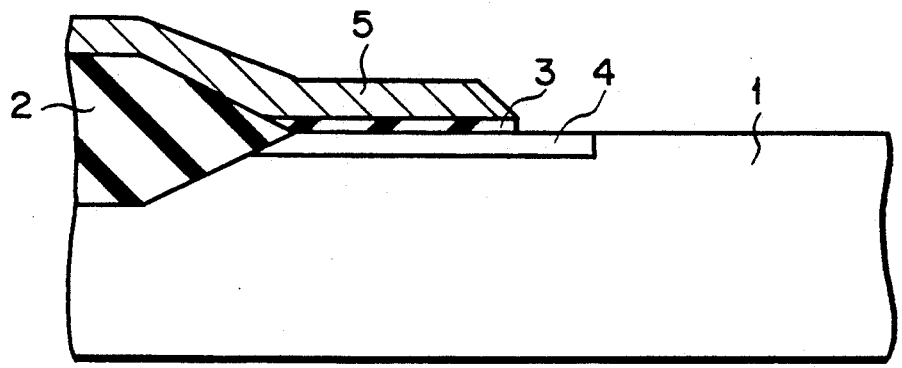
FIG. 1 is a cross-sectional view showing a conventional cell capacitor.

An embodiment of the present invention will be described with reference to FIG. 2. As illustrated in FIG. 2A, an $N^+$ diffusion layer 23 is formed on a P-type silicon substrate 21 and an oxide film 22 is deposited thereon by the CVD method. The oxide film 22 is patterned to overgrow an $N^+$ epitaxial layer 24 on the $N^+$ diffusion layer 23 by the SEG method. As illustrated in FIG. 2B, the oxide film 22 is removed by etching, and the surfaces of the $N^+$ diffusion layer 23 and $N^+$ epitaxial layer 24 are thermally oxidized to form an oxide film 25 of 100 Å in thickness. A polysilicon 26 is deposited on the surface of the oxide film 25 and then patterned to form a plate electrode 26. A high-integrated cell capacitor, since the $N^+$ epitaxial layer 24 serving as a lower electrode has a mushroom-shaped section, the surface of the lower electrode is enlarged per unit of area; accordingly, the opposing surfaces of the $N^+$ epitaxial layer 24 and the plate electrode 26 are increased in area and a cell capacitor having a large capacity can thus be formed within a small area.

To further enhance the degree of integration of the cell capacitor, as shown in FIG. 3, another CVD oxide film (not shown) is deposited before forming the plate electrode 26 shown in FIG. 2 or after forming a thermal oxide film $25_1$ (corresponding to the oxide film 25 shown in FIG. 2) and then patterned and an $N^+$ epitaxial layer $24_2$ (corresponding to the $N^+$ epitaxial layer 24 shown in FIG. 2) is overgrown on another $N^+$ epitaxial layer 241 (corresponding to the $N^+$ epitaxial layer 24 shown in FIG. 2). (When the CVD oxide film is patterned, the oxide film 251 on the $N^+$ epitaxial layer 241 is also patterned.) A thermal oxide film 252 (corresponding to the oxide film 25 shown in FIG. 2) is then formed on the layer $24_2$ and a polysilicon plate electrode 26 is formed. A two-layered $N^+$ epitaxial layer ($24_1$, 24₂) can thus be formed. Consequently, the degree of integration of the cell capacitor shown in FIG. 3 is higher than that of the cell capacitor shown in FIG. 2.

Using the above process, a plurality of N+ epitaxial layers can be formed on one another in the vertical direction so that a higher degree of integration can be achieved.

In forming the second N+ epitaxial layer in the cell capacitor shown in FIG. 3, if a plurality of hole patterns is formed in the CVD oxide film and then the second N+epitaxial layer is overgrown, the degree of integration of the cell capacitor can be made much higher. In the lithographic technique, the relationship in position between the adjacent overgrow epitaxial layers depends upon the shape of a mask. Since the epitaxial layers can be controlled so as not to contact each other by accident, self-alignment can be attained and the insulation film 25 between the electrodes need not be thinned, as described in the Background of the Invention. The cell capacitor can thus be improved in reliability. Since the N+ epitaxial layer 24 is used, no N+ ions need not be implanted and therefore the manufacturing steps can be considerably simplified.

The present invention is not limited to the above embodiments but can be applied to various devices. In the above embodiments, the electrode can be overgrown like a mushroom in shape, using a semiconductor, by the selective epitaxial growth method. For example, the same electrode can be overgrown, using metal such as tungsten (W), by the selective growth method.

As described above, the cell capacitor according to the present invention is increased in degree of integration, improved in reliability, and simple to manufacture.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a lower electrode formed on said semiconductor substrate having a cross section comprising a lower part and an upper part having a lower periphery with lateral ends defining a width which is greater than a width of said lower part, said upper part having a central portion which overlies said lower part, wherein a height of said upper part decreases from said central portion to said lateral ends of said upper part;
   an insulation film overlying at least said lower electrode and in contact with a portion of said upper part of said lower electrode; and
   an upper electrode opposing said lower electrode and formed so as to cover at least said insulation film, wherein said lower electrode, said insulation film, and said upper electrode form a capacitor.

2. The semiconductor device according to claim 1, wherein at least one additional electrode is disposed on said lower electrode.

3. The semiconductor device according to any one of claims 1 and 2, wherein said capacitor is a memory cell capacitor.

4. The semiconductor device according to any one of claims 1 and 2, wherein said lower electrode is formed of a semiconductor.

5. The semiconductor device according to any one of claims 1 and 2, wherein said lower electrode is formed of metal.

6. The semiconductor device according to claim 2, wherein said at least one additional is electrically connected to said lower electrode.

7. A semiconductor device comprising:
   a first electrode formed on a major surface of a body of semiconductor material and having a cross section comprising a lower part and an upper part, wherein a width of the upper part is greater than a width of the lower part and wherein a height of the upper part decreases from a central axis of the upper part to lateral ends of the upper part;
   an insulation film covering at least a portion of said first electrode; and
   an second electrode opposing said first electrode and covering at least a portion of said insulation film.

8. A semiconductor device according to claim 7, wherein said insulation film and said first and second electrodes form a memory cell capacitor.

9. A semiconductor device according to claim 8, wherein:
   said insulation film extends about a periphery of the upper part of said first electrode and about a side wall of the lower part of said first electrode.

10. A semiconductor device according to claim 9, wherein said second electrode opposes said first electrode about the periphery of the upper part of said first electrode and about the side wall of the lower part of said first electrode.

11. A semiconductor device according to claim 8, further comprising a third electrode disposed on said first electrode and beneath said insulation film, said third electrode being in electrical contact with said first electrode.

12. A semiconductor device according to claim 11, wherein:
   said third electrode comprises a lower part and an upper part disposed on the lower part, wherein a width of the upper part is greater than a width of the lower part, a height of the upper part decreases from a central axis of the upper part to lateral ends of the upper part, and the lower part is disposed on the upper part of said first electrode; and
   said insulation film extends about the periphery of the upper part of said first and third electrodes and about a side wall of the lower part of said first and third electrodes.

13. A semiconductor device according to claim 12, wherein said second electrode opposes said first electrode and said third electrode about the periphery of the upper part of said first and third electrodes and about the side wall of the lower part of said first and third electrodes.

14. A semiconductor device comprising:
   a first electrode formed on a major surface of a body of semiconductor material, said first electrode having a cross section comprising a stem portion contacting the major surface and a bulbous portion extending from the stem portion distal the major surface, wherein a height of said bulbous portion decreases from a central axis of said bulbous portion to peripheral ends thereof;

an insulation film covering at least a portion of the said first electrode; and a second electrode opposing said first electrode and covering at least a portion of said insulation film.

15. A semiconductor device according to claim 14, wherein said insulation film and said first and second electrodes form a memory cell capacitor.

16. A semiconductor device according to claim 15, wherein said insulation film extends about the periphery of the bulbous portion of said first electrode and about a side wall of the stem portion of said first electrode.

17. A semiconductor device according to claim 16, wherein said second electrode opposes said first electrode about the periphery of the bulbous portion of said first electrode and about the side wall of the stem portion of said first electrode.

18. A semiconductor device according to claim 17, further comprising a third electrode disposed on said first electrode and beneath said insulation film, said third electrode having a stem portion being in electrical contact with the bulbous portion of said first electrode and a bulbous portion extending from the stem portion of said third electrode distal said bulbous portion of said first electrode.

19. A semiconductor device according to claim 18, wherein said insulation film extends about the periphery of the bulbous portion of said first and third electrodes and about a side wall of the stem portion of said first and third electrodes.

20. A semiconductor device according to claim 19, wherein said second electrode opposes said first electrode and said third electrode about the periphery of the bulbous portion of said first and third electrodes and about the side wall of the stem portion of said first and third electrodes.

21. A semiconductor device comprising:
a semiconductor substrate;
a lower electrode formed on said semiconductor substrate having a cross section comprising a lower part having lateral edges transverse to said semiconductor substrate and an upper part having a lower periphery with lateral ends, said upper part being disposed on said lower part opposite to said semiconductor substrate thereby forming overhanging portions where the lateral ends of said lower periphery extend laterally beyond said lateral edges of said lower part and a central portion where said upper part overlies said lower part, wherein a height of said upper part decreases from the central portion to said lateral ends of said upper part;
an insulation film formed so as to cover at least said lower electrode; and
an upper electrode opposing said lower electrode and formed so as to cover at least said insulation film,
wherein said lower electrode, said insulation film, and said upper electrode form a capacitor.

22. A semiconductor device comprising:
a first electrode formed on a major surface of a body of semiconductor material and comprising a lower stem portion and an upper portion having a cross section that is convex with respect to an upper plan view thereof;
an insulation film covering at least a portion of said first electrode; and
an second electrode opposing said first electrode and covering at least a portion of said insulation film.

* * * * *